US006791594B2

(12) United States Patent
Takeuchi

(10) Patent No.: US 6,791,594 B2
(45) Date of Patent: Sep. 14, 2004

(54) LASER IMAGING APPARATUS

(75) Inventor: Shuichi Takeuchi, Saitama-ken (JP)

(73) Assignee: PENTAX Corporation, Tokyo (JP)

( * ) Notice: Subject to any disclaimer, the term of this patent is extended or adjusted under 35 U.S.C. 154(b) by 209 days.

(21) Appl. No.: 09/879,161

(22) Filed: Jun. 13, 2001

(65) Prior Publication Data

US 2001/0053164 A1 Dec. 20, 2001

(30) Foreign Application Priority Data

Jun. 14, 2000 (JP) ......................................... 2000-178253

(51) Int. Cl.[7] .............................. B41J 27/00; B41J 15/14

(52) U.S. Cl. ....................................... 347/241; 347/256

(58) Field of Search ................................ 347/241, 243, 347/244, 256, 258, 259, 234, 233, 235, 239, 248, 250; 359/583, 889, 204, 890; 250/235

(56) References Cited

U.S. PATENT DOCUMENTS 4,806,753 A * 2/1989 Noguchi ...................... 250/235
5,587,825 A * 12/1996 Iizuka ........................ 359/204
6,141,030 A * 10/2000 Fujita et al. ................ 347/233

* cited by examiner

Primary Examiner—Hai Pham
(74) Attorney, Agent, or Firm—Greenblum & Berstein, P.L.C.

(57) ABSTRACT

A laser imaging apparatus is provided with a light source unit that emits a laser beam including a first beam and a second beam. The central axes of the first beam and the second beams substantially coincide with each other. The first beam includes non-visible light, and the second beam includes visible light. The imaging apparatus further includes a modulating system that modulates the beam emitted by the light source unit, a deflecting system that deflects the beam modulated by the modulating system to scan within a predetermined angular range, and an imaging optical system that converges the deflected beam to form a scanning beam spot on a surface to be scanned.

22 Claims, 6 Drawing Sheets

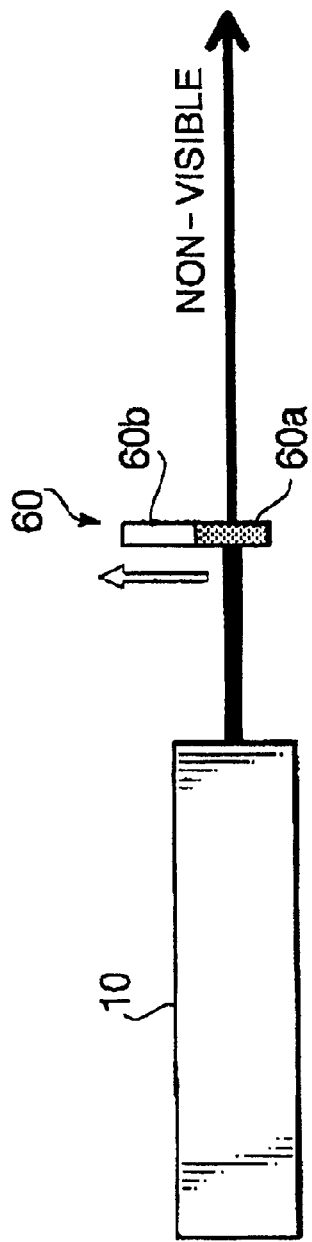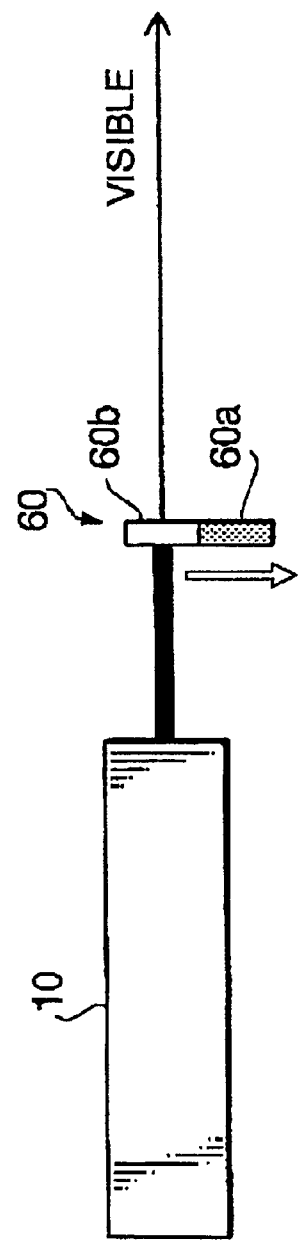

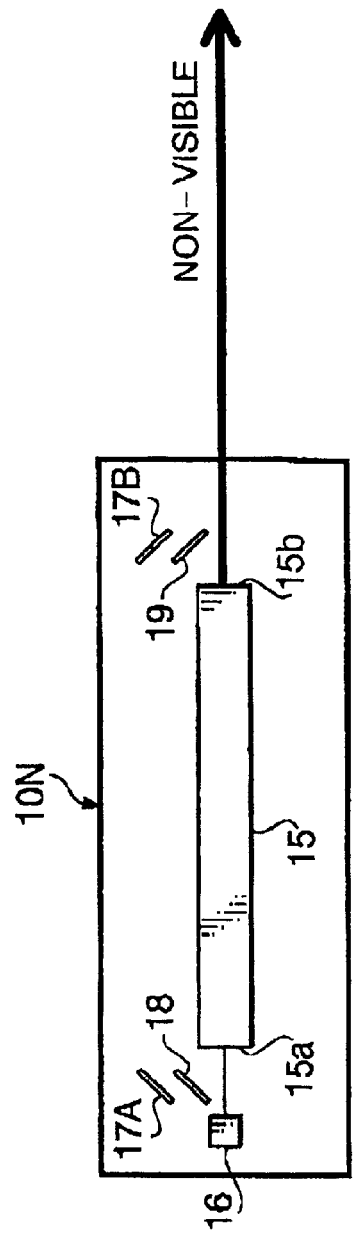
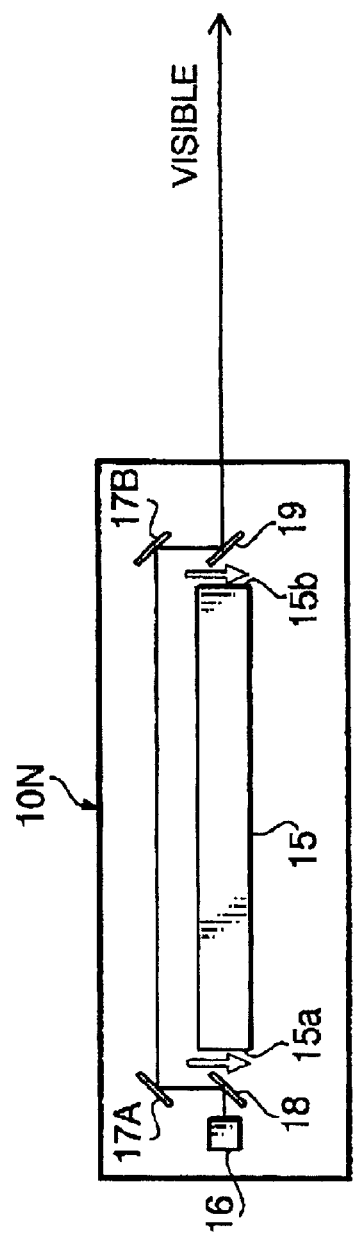

LASER IMAGING APPARATUS

BACKGROUND OF THE INVENTION

The present invention relates to a laser imaging apparatus which forms an image pattern on a surface to be exposed to light using a beam of non-visible light.

Conventionally, a laser imaging apparatus such as a direct imager of a laser photo plotter has been used for forming a circuit pattern or the like on a printed circuit board or a semiconductor element. In such an imaging apparatus, a substrate carrying a photo-resist is exposed to an image pattern so that the circuit pattern is directly formed thereon.

In such an imaging apparatus, if a gas laser device or a solid laser source which cannot emit an ON-OFF modulated laser beam as a laser source is used, a modulator such as an AOM (acousto-optical modulator) should be used, which complicates the structure of an optical system thereof.

Further, in such an imaging apparatus, when the light source is exchanged, for example, the position/orientation of the exchanged light source should be adjusted with respect to the optical axis of the optical system. If the wavelength of the laser beam is greater than 700 nm (nanometer), or less than 400 nm, since the beam is invisible to the human eyes, a camera or a fluorescent plate should be used to check the position of the beam passing through each component of the optical system. Such a checking procedure is very troublesome.

SUMMARY OF THE INVENTION

It is therefore an object of the invention to provide an improved laser imaging apparatus, alignment (positioning) of which can easily be done even though the non-visible laser beam is used for imaging.

For the above object, according to the present invention, there is provided a laser imaging apparatus, that is provided with a light source unit that emits a laser beam including a first beam and a second beam, central axes of the first beam and the second beams substantially coinciding with each other, the first beam including non-visible light, the second beam including visible light, a modulating system that modulates the beam emitted by the light source unit, a deflecting system that deflects the beam modulated by the modulating system, the deflected beam scanning within a predetermined angular range, and an imaging optical system that converges the deflected beam to form a scanning beam spot on a surface to be scanned.

Since the first beam includes the visible light, and the central axes of the first beam and the second beams coincide with each other, the alignment can easily be performed using the visible light.

In a particular case, the first beam is used for forming an image on the surface to be scanned, and the second beam is used for the alignment.

Optionally, the first beam includes light having one or more wavelengths within the non-visible wavelength range, and the second beam includes light having at least one wavelength within the visible wavelength range.

In one configuration, the light source unit may include a first laser source that emits the first beam, a second laser source that emits the second beam, and a beam combining optical system that combines the first beam and second beam such that the central axes of the first beam and the second beam coincide with each other.

In a particular case, one of the first beam and the second beam is emitted from the light source unit as a P-polarized beam and the other of the first beam and the second beam is emitted from the light source unit as an S-polarized beam, and the beam combining optical system includes a polarized beam combiner that receives the P-polarized beam and the S-polarized beam and combines the received beams such that the central axes of the first beam and the second beam coincide with each other.

Optionally, the second laser source may include a laser diode that emits a laser beam having a visible wavelength, and a collimating lens that collimates the laser beam emitted by the laser diode, the collimated beam being the second beam.

In another configuration, the light source unit may include an excitation light source that emits the second beam, which serves as an excitation beam, having a visible wavelength, laser medium that i s excited by the excitation beam to emit the first beam, and a switching system that switches optical paths of the laser beam emitted by the excitation light source such that the laser beam emitted by the excitation light source is emitted from the light source unit or the laser beam emitted by the excitation light source is incident on the laser medium, the first beam being emitted by the laser medium in response to incident of the excitation beam on the laser medium.

Optionally, the laser imaging apparatus may be configured such that only the first beam is directed from the light source unit to the modulating optical system when imaging is performed, and only the second beam is directed from the light source unit to the modulating optical system when alignment is performed.

Optionally, the laser imaging apparatus may include a filtering system provided between the light source unit and the modulating optical system, for selectively transmitting one of the first beam and the second beam.

In this case, the filtering system may include a filtering optical element formed with a first area that transmits only the non-visible light and a second area that transmits only the visible light, the filtering optical element being movable between a first position and a second position, the first area being inserted in an optical path between the light source unit and the modulating optical system when the filtering optical element is located at the first position, the second area being inserted in the optical path between the light source unit and the modulating optical system when the filtering optical element is located at the second position.

If the light source unit includes a first laser source that emits the first beam, a second laser source that emits the second beam, and a beam combining optical system that combines the first beam and second beam such that the central axes of the first beam and the second beam coincide with each other, the first laser source and the second laser source may be selectively actuated so that one of the first beam and the second beam is emitted at a time.

In another configuration, the laser imaging apparatus may include a beam separating optical system that separates the first beam from the second beam so that only the first beam is incident on the surface to be scanned.

In a particular case, the beam separating optical system may be provided on a downstream side of the modulating optical system and on an upstream side of the surface to be scanned.

In a particular example, the beam separating optical system includes a dichroic mirror. Alternatively, a dychroic prism may be employed instead of the dychroic mirror.

Optionally, the modulating optical system may include a reduction optical system that reduces a diameter of a beam incident thereon, a modulator that ON-OFF modulates an incident beam in accordance with an image pattern to be formed on the surface to be scanned, and a collimating lens that collimates the beam modulated by the modulator.

In this case, the modulator may include an acousto-optical modulator.

Optionally, a chromatic aberration of the modulating optical system in respect to the first beam and the second beam is compensated for.

Further optionally, the non-visible light is ultraviolet light.

Still optionally, the light source unit includes a filter that reduces the intensity of the visible light.

BRIEF DESCRIPTION OF THE ACCOMPANYING DRAWINGS

FIGS. 2A and 2B show positions of wavelength selecting filters when imaging and alignment are performed, respectively:

FIGS. 6A and 6B show configurations of a light source when imaging and alignment are performed, respectively.

DESCRIPTION OF THE EMBODIMENTS

First Embodiment

Figure 1:
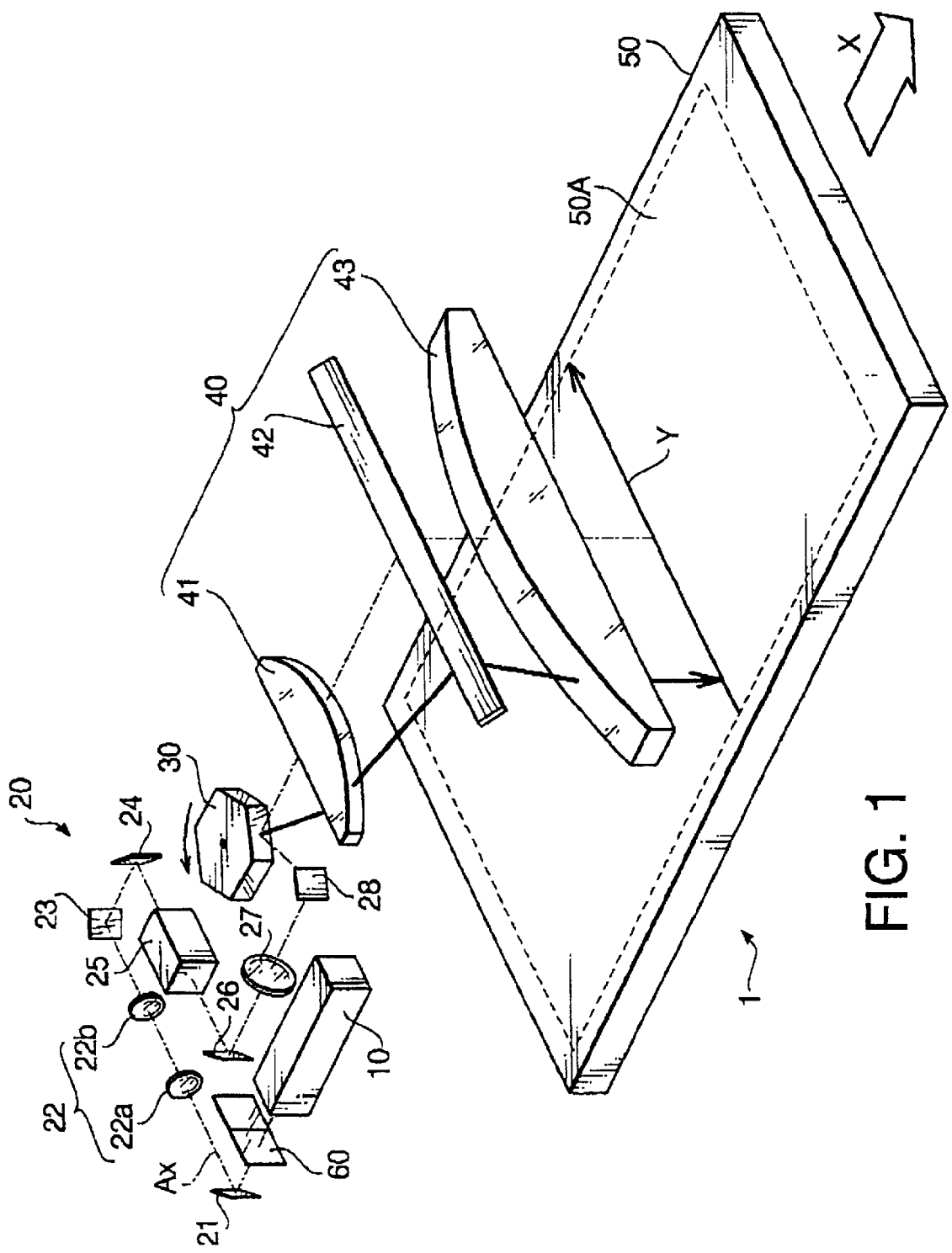
FIG. 1 is a perspective view of an optical system of a laser imaging apparatus according to a first embodiment of the invention.

FIG. 1 is a perspective view of an optical system of a laser imaging apparatus 1 according to a first embodiment of the invention.

The laser imaging apparatus 1 includes a laser source 10, a band pass filter 60, a modulating optical system 20, a polygonal mirror 30, and an imaging optical system 40.

The laser source 10 emits a beam including two wavelength components, i.e., visible and non-visible wavelength components, as parallel light. The laser beam emitted by the laser source 10 is incident on the modulating optical system 20 via the band pass filter 60, which selectively transmits one of the wavelength components included in the beam.

The modulating optical system 20 includes a reduction optical system 22 including first and second lenses 22a and 22b, an AOM (acousto-optical modulator) 25, and a collimating lens 27. Optical axes of the reduction optical system 22, the AOM 25 and the collimating lens 27 are arranged on the same axis AX, which is bent by beam benders 23, 24 and 26. Hereinafter, the axis AX is referred to as the optical axis of the modulating optical system 20. A light source side of the optical axis AX is bent by the beam bender 21 toward the light source 10, the bent axis coincides with the principal ray of the beam emitted by the laser source 10. The collimating lens side of the optical axis AX is bent by the beam bender 28 and is directed toward an reflecting surface of the polygonal mirror 30.

The beam incident on the modulating optical system 20 is reflected by the beam bender 21 and is incident on the reduction optical system 22. The diameter of the beam is reduced by the reduction optical system 22 (i.e., the lenses 22a and 22b), and then the beam is reflected by the beam benders 23 and 24 so as to be directed to the AOM 25.

The AOM 25 is provided with an acousto-optical element made of a crystal exhibiting the acousto-optical effect. That is, when a super-sonic wave is applied to the AOM 25, the refractive index thereof changes periodically so that the incident beam is diffracted. In the embodiment, the AOM 25 is controlled in accordance with image data so that the beam passed through the AOM 25 is ON-OFF modulated corresponding to the image data.

The ON-OFF modulated laser beam is reflected by the beam bender 26 and is incident on the collimating lens 27, which collimate the incident beam, which is a diverging beam. The beam collimated by the collimating lens 27 is reflected by the beam bender 28, and is directed to the polygonal mirror 30.

The polygonal mirror 30 includes a plurality of reflection surfaces. The polygonal mirror 30 is rotated about its rotation axis at a predetermined fixed angular speed. As the polygonal mirror 30 revolves, the beam, which is reflected by the reflection surfaces, scans within a predetermined angular range. The scanning beam is incident on the imaging optical system 40.

The imaging optical system 40 includes an fθ lens 41, a mirror 42 and a condenser lens 43. The scanning beam, which is deflected by the polygonal mirror 30, passes through the fθ lens 41 and is reflected by the mirror 42 toward a surface 50A of a substrate 50 to be scanned via the condenser lens 43. It should be noted that the laser beam is incident on the surface 50A substantially perpendicularly, to form a beam spot, which moves on the surface 50A at a constant speed in a Y-axis direction, which will be referred to as a main scanning direction.

The substrate 50 is fixedly mounted on the table (not shown) placed on the laser imaging apparatus 1. The table is slidably mounted on a pair of rails fixedly mounted on a base of the laser imaging apparatus 1 The table is driven by a driving system so as to be reciprocally movable in an X-axis direction (which will be referred to as an auxiliary scanning direction) perpendicular to the Y-axis direction in a plane parallel to the surface 50A. As the polygonal mirror 30 rotates to form a scanning line with the moving beam spot, the table is driven to move in the X-axis direction, thereby a two-dimensional image is formed on the surface 50A.

It should be noted that, when the laser imaging apparatus 1 is assembled, or the laser source 10 is exchanged to another, alignment, i.e., an adjustment of the optical axis of the optical system 20 relative to the principal ray of the beam emitted by the laser source 10 should be performed.

According to the embodiment, when the alignment is performed, the wavelength selecting filter 60 is used and the visible light component included in the beam emitted by the laser source 10 is utilized for the alignment.

FIGS. 2A and 2B show the light source 10 and the positions of wavelength selecting filter 60 when the imaging and alignment are performed, respectively.

Specifically, FIG. 2A shows a configuration when the imaging is performed, and FIG. 2B shows a configuration when the alignment is performed.

The wavelength selecting filter 60 has two areas: a first area 60a and a second area 60b. The two areas 60a and 60b are rectangular areas formed with different coatings. The first area 60a is formed with a coating which allows only non-visible light to pass through, while the second area 60b is formed with a coating which allows only visible light to pass through.

The wavelength selecting filter 60 is arranged such that the light receiving surface is perpendicular to the laser beam emitted by the laser source 10. Further, the filter 60 is movable in a direction parallel to the light receiving surface thereof so that either of the first and second areas 60a and 60b is inserted within an optical path.

When the alignment is performed, the filter 60 is located, as shown in FIG. 2B, at a position where the laser beam passes through the second area 60b. Then, only the visible light component passes through the filter 60 (i.e., the second area 60b), and the visible component is incident on the modulating optical system 20.

Thus, an operator is capable of visually recognizing the positions of a laser beam passing at the reduction optical system 22, the AOM 25 and the collimating lens 27. Therefore, the operator can adjust the position of optical elements 21–28 easily so that the beam proceeds along the optical axes thereof.

After the alignment has been finished and when the imaging is performed, the filter 60 is located, as shown in FIG. 2A, at a position where the first area 60a is inserted in the optical path of the laser beam emitted by the laser source 10. Then, only the non-visible light component passes through the filter 60, and is incident on the modulating optical system 20.

According to the first embodiment, the laser source 10 is configured such that the principal rays of the visible light and non-visible light coincide with each other, and therefore, once the alignment is performed using the visible light, it is ensured that the non-visible light proceeds along the same path as the visible light.

It should be noted that, the modulating optical system 20 is designed for the non-visible light which has a different wavelength from that of the visible light. Therefore, when the alignment is performed using the visible light, the focal points may be different from those when the non-visible light is used. However, the purpose of the alignment is to adjust the positional relationships of the optical elements with respect to the beam emitted by the laser source 10, and therefore, the defocus due to the difference of the wavelengths does not affect the function. Optionally, the optical system 20 may be designed to compensate for chromatic aberrations.

In a particular case, the surface 50A may be provided with photosensitive material which is sensitive only to the non-visible light. In such a case, it is possible to omit the filter 60, and let the both light components be incident on the surface 50A simultaneously. However, if the laser source 10 is a gas laser source and the non-visible light is ultra-violet light, the intensity of the visible light is considerably strong with respect to that of the ultra-violet light, and the photosensitive material may be photosensitized by the visible light. Therefore, even in such a case, it is preferable that the unused light component should be removed.

In the above-described embodiment, the laser source 10 emits light including two wavelength components, a visible component and a non-visible component. However, the invention is not limited to this configuration, and the visible and non-visible component may include more than one component.

Second Embodiment

Figure 3:
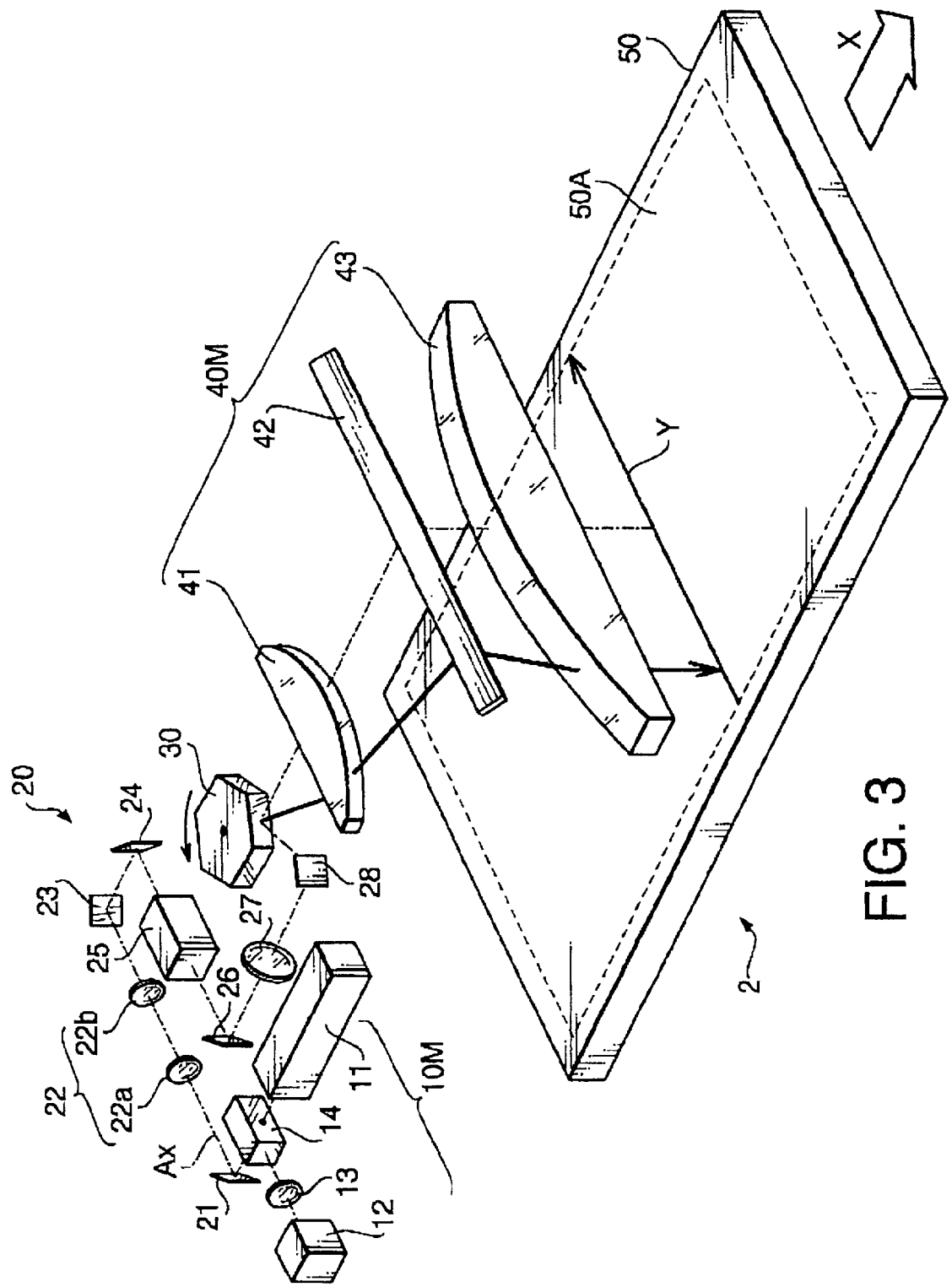
FIG. 3 is a perspective view of an optical system of a laser imaging apparatus according to a second embodiment of the invention.
Figure 4:
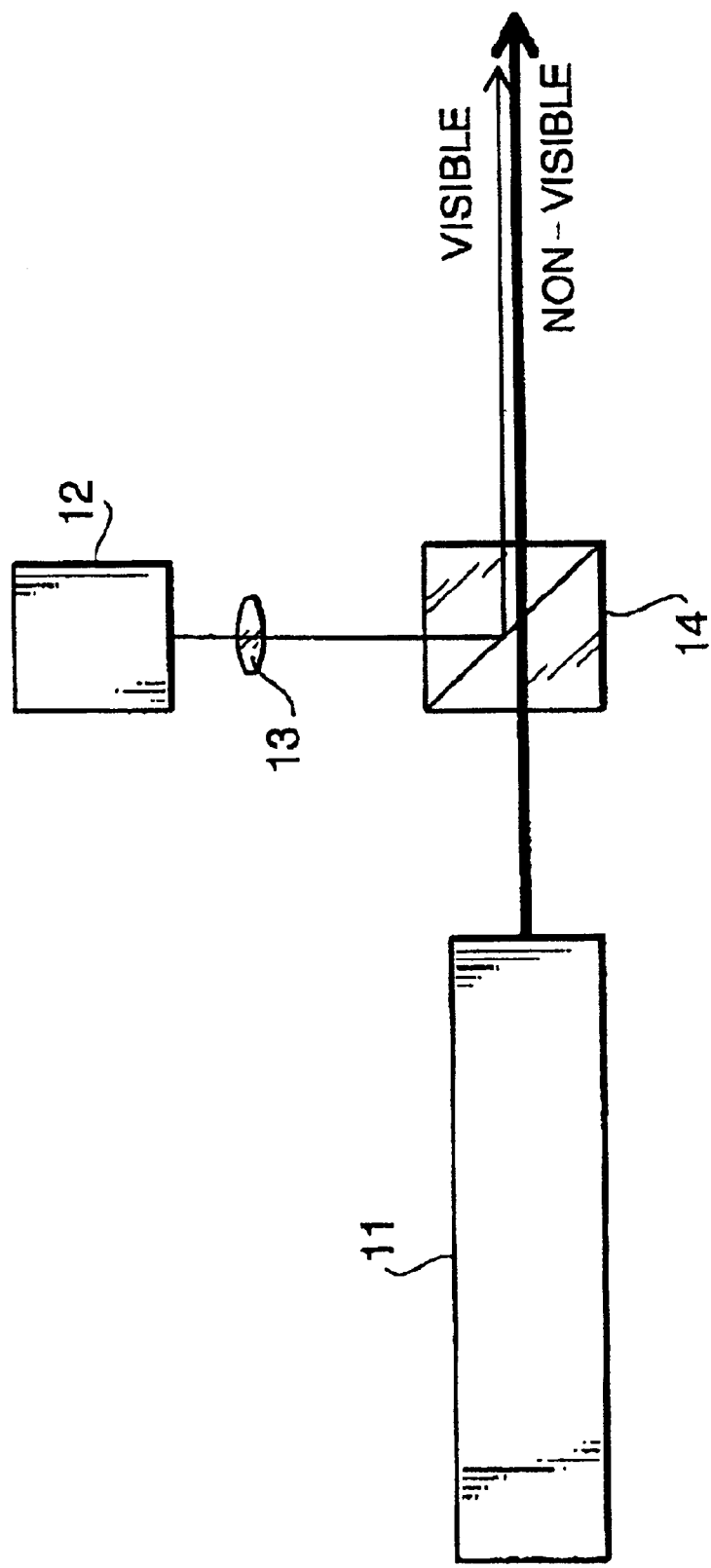
FIG. 4 illustrates a structure of a light source.

FIG. 3 is a perspective view of an optical system of a laser imaging apparatus 2 according to a second embodiment of the invention. FIG. 4 illustrates a structure of a light source 10M of the laser imaging apparatus 2.

In the laser imaging apparatus 2, the laser source 10 of the laser imaging apparatus 1 is replaced with the laser source 10M, which includes laser sources 11 and 12, a collimating lens 13 and a beam combiner 14. Further, the wavelength selecting filter 60 is not employed, and the mirror 42 of the imaging optical system 40 is replaced with a dychroic mirror 44. The other structure is similar to that of the laser imaging apparatus 1 according to the first embodiment. Therefore, the same reference numbers are assigned to the elements similar to those used in the first embodiment, and description thereof will not be repeated.

As described above, the light source 10M includes a first laser source 11, a second laser source 12, the collimating lens 13 and the polarization beam combiner 14.

The laser source 11 emits a laser beam having only a non-visible light component, and the laser source 12 emits a laser beam having only a visible light component.

The first laser source 11 is arranged such that the laser beam emitted therefrom is incident on the polarization beam combiner 14 as P polarized light, while the second laser source 12 is arranged such that the laser beam emitted therefrom is incident on the polarization beam combiner 14 as S polarized light. A laser diode is used as the second laser source 12. Since the beam emitted by the laser diode diverges, the collimating lens 13 is provided to collimate the beam emitted by the second laser source 40.

The polarization beam combiner 14 allows the P-polarized beam from the first laser source 11 to pass through, and reflects the S-polarized beam from the second laser source 12. Thus, both of the beams emitted by the first and second laser sources 11 and 12 are combined to proceed along the same axis as a single beam and the combined beam is incident on the modulating optical system 20.

The combined beam incident on the modulating optical system 20 is reflected by the beam bender 21. Then, by the reduction optical system 22 (which includes the first and second lenses 22a and 22b), the diameter of the beam is reduced. The beam is then incident on the AOM 25 via the beam benders 23 and 24, and ON-OFF modulated in accordance with the image data. The modulated beam is reflected by the beam bender 26, collimated by the collimating lens 27, and is incident on the polygonal mirror 30 via the beam bender 28.

The beam deflected by the polygonal mirror 30, which rotates at a constant speed about its rotational axis, is converged by the imaging optical system 40M and forms a scanning beam spot on the surface 50A. The beam spot formed on the surface 50A moves on the surface 50A in the Y-axis direction at a constant speed as the polygonal mirror 30 rotates.

The dychroic mirror 44 arranged between the fθ lens 41 and the condenser lens 43 is formed with a coating which reflects the non-visible light, and transmits the visible light. Therefore, the dychroic mirror 44 reflects the non-visible light component of the combined beam toward the surface 50A, and transmits the visible light component of the combined beam.

With this configuration, when the laser imaging apparatus 2 is assembled or the laser source 10M (e.g., the laser source 11) is exchanged to another, and the alignment is to be performed, the combined beam including the visible light component is used.

It should be stressed that, since the dychroic mirror 44 is provided, the visible light component of the combined beam is not directed toward the surface 50A, and image formation is performed only with the non-visible light component of the combined beam.

Similarly to the first embodiment, the modulating optical system 20 is designed for the non-visible light which has a different wavelength from that of the visible light. Therefore, when the alignment is performed using the visible light, the focal points may be different from those when the non-visible light is used. However, the purpose of the alignment is to adjust the positional relationships of the optical elements with respect to the beam emitted by the laser source 10M, and therefore, the defocus due to the difference of the wavelengths does not affect the function. Optionally, the optical system 20 may be designed to compensate for chromatic aberrations.

As described above, according to the second embodiment, the alignment can be performed easily.

Third Embodiment

Figure 5:
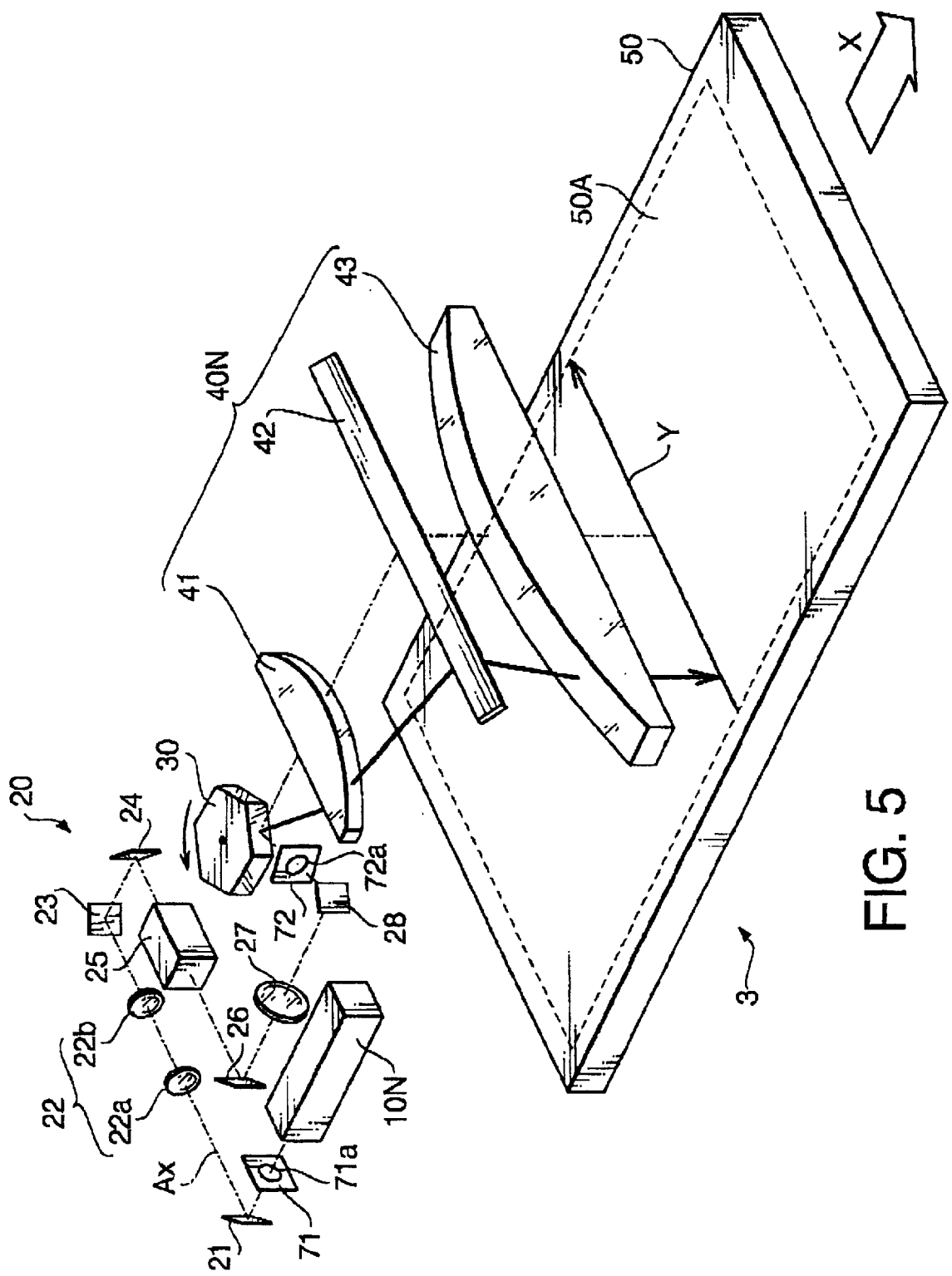
FIG. 5 is a perspective view of an optical system of a laser imaging apparatus according to a third embodiment of the invention.

FIG. 5 is a perspective view of an optical system 10N of a laser imaging apparatus 3 according to a third embodiment of the invention, and FIGS. 6A and 6B show configurations of the optical system 10N when non-visible and visible light is emitted, respectively.

The laser imaging apparatus 3 is provided with the laser source 10N instead of the laser source 10 and the filter 60 of the first embodiment, and further, metal plates 71 and 72 respectively formed with pin holes 71a and 72a are provided in the laser image apparatus 3. The other structure is substantially the same as that of the first embodiment. Therefore, the same reference numbers are given to the components which are the same as those employed in the first embodiment, and description thereof will not be repeated.

The laser source 10N is provided with a laser rod formed with laser transmitting medium, and an excitation light source 16 which emits a laser beam having a wavelength of a visible range and functioning as excitation light for the laser rod 15. The laser source 10N is further provided with mirror 17A and 17B, and movable mirrors 18 and 19 for switching light beams.

When an image is formed, as shown in FIG. 6A, the laser beam emitted by the excitation light source 16 is incident on an incident end 15a of the laser rod 15. Then, the laser medium is excited and a non-visible laser beam is emitted from an emitting end 15b of the laser rod 15.

When the laser imaging apparatus 3 is assembled or the laser source 10N is exchanged to another, in order for performing the alignment, the movable mirror 18 and 19 are driven to move. FIG. 6B shows a configuration when the movable mirrors 18 and 19 have been moved in position for the alignment. AS shown in FIG. 6B, the movable mirror 18 is inserted between the excitation light source 16 and the laser rod 15, while the movable mirror 19 is located in the vicinity of the light emitting end 15b of the laser rod 15.

In this configuration, the visible laser beam emitted by the excitation laser source 16 is reflected by the movable mirror 18, the mirrors 17A and 17B and the movable mirror 19. It should be noted that the principal ray of the visible beam reflected by the movable mirror 19 proceeds along the same axis, along which the non-visible beam emitted by the laser rod 15 proceeds.

With this construction, when the alignment is performed, the movable mirrors 18 and 19 are located to the positions shown in FIG. 6B. After the alignment has been finished, the movable mirror 18 and 19 are retracted so as not to interfere with the path of the beam emitted by the excitation light source 16 to the laser rod 15, and the path of the beam emitted by the laser rod 15.

Further to the above configuration, the metal plate 71 is arranged between the laser source 10N and the beam bender 21, and the metal plate 72 is arranged between the beam bender 28 and the polygonal mirror 30. The metal plates 71 and 72 are fixed on a base member of the laser imaging apparatus 3. The metal plates 71 and 72 are formed with pin holes 71a and 72a, respectively, for adjusting the optical axis.

When the alignment is performed, positions of the components 21–28 are adjusted, respectively, such that the optical axis of the modulating optical system 20 passes through the pinholes 71a and 72a. Then, the visible laser beam is emitted from the laser source 10N to the pinhole 71a. Then, the operator visually identifying the position of the laser beam passing through the reduction optical system 22, the AOM 25, the collimating lens 27, in the vicinity of the optical axes thereof, and adjust the positions of the optical components 21–28. Particularly, the position of the light source 10N should be adjusted so that the emitted beam passes through the pinhole 71a of the metal plate 71, and the beam reflected by the mirror 28 passes through the pinhole 72a of the metal plate 72.

Since the positions of the metal plates 71 and 72 are fixed, the optical axis of the modulating optical system 20 can be maintained at the substantially same position at every alignment. Further, the laser bean is incident on the polygonal mirror 30 at the same angle.

It should be noted that, the modulating optical system 20 is designed for the non-visible light which has a different wavelength from that of the visible light. Therefore, when the alignment is performed using the visible light, the focal points may be different from those when the non-visible light is used. However, the purpose of the alignment is to adjust the positional relationships of the optical elements with respect to the beam emitted by the laser source 10N, and therefore, the defocus due to the difference of the wavelengths does not affect the function. Optionally, the optical system 20 may be designed to compensate for chromatic aberrations.

The present disclosure relates to the subject matter contained in Japanese Patent Application No. 2000-178253, filed on Jun. 14, 2000, which is expressly incorporated herein by reference in its entirety.

What is claimed is:

1. A laser imaging apparatus, comprising:
   a light source unit that emits a laser beam including a first beam and a second beam, central axes of the first and second beams substantially coinciding with each other, the first beam including non-visible light, the second beam including visible light;
   a modulating optical system that modulates the beam emitted by said light source unit, the first beam configured to form an image on the surface to be scanned, the second beam being configured to align the modulating optical system by adjusting a positional relationship of the first beam with respect to the optical axis of the modulating optical system;
   a deflector that deflects the beam modulated by said modulating optical system, the deflected beam scanning within a predetermined angular range; and
   an imaging optical system that converges the deflected beam to form a scanning beam spot on a surface to be scanned.

2. The laser imaging apparatus according to claim 1, the first beam including light having one or more wavelengths within the non-visible wavelength range, the second beam including light having at least one wavelength within the visible wavelength range.

3. The laser imaging apparatus according to claim 1, wherein said light source unit includes:
   a first laser source that emits the first beam;
   a second laser source that emits the second beam; and
   a beam combining optical system that combines the first beam and second beam such that the central axes of the first beam and the second beam coincide with each other.

4. The laser imaging apparatus according to claim 3, wherein one of the first beam and the second beam is emitted from said light source unit as a P-polarized beam and the other of the first beam and the second beam is emitted from said light source unit as an S-polarized beam, and wherein said beam combining optical system includes a polarized beam combiner that receives the P-polarized beam and the S-polarized beam and combines the received beams such that the central axes of the first beam and the second beam coincide with each other.

5. The laser imaging apparatus according to claim 4, wherein said second laser source includes:
 a laser diode that emits a laser beam having a visible wavelength; and
 a collimating lens that collimates the laser beam emitted by said laser diode, the collimated beam being the second beam.

6. The laser imaging apparatus according to claim 3, wherein said first laser source and said second laser source are selectively actuated so that one of the first beam and the second beam is emitted.

7. The laser imaging apparatus according to claim 1, wherein said light source unit includes:
 an excitation light source that emits the second beam, which serves as an excitation beam, having a visible wavelength;
 a laser medium that is excited by the excitation beam to emit the first beam; and
 a switching system that switches optical paths of the laser beam emitted by said excitation light source such that the laser beam emitted by said excitation light source is emitted from said light source unit or is incident on said laser medium, the first beam being emitted by said laser medium in response to incidence of the excitation beam on said laser medium.

8. The laser imaging apparatus according to claim 1, wherein only the first beam is directed from said light source unit to said modulating optical system when imaging is performed, and wherein only the second beam is directed from said light source unit to said modulating optical system when alignment is performed.

9. The laser imaging apparatus according to claim 1, further including a filtering system provided between said light source unit and said modulating optical system, said filtering system selectively transmits one of the first beam and the second beam.

10. The laser imaging apparatus according to claim 9, wherein said filtering system includes a filtering optical element formed with a first area that transmits only the non-visible light and a second area that transmits only the visible light, said filtering optical element being movable between a first position and a second position, said first area being inserted in an optical path between said light source unit and said modulating optical system when said filtering optical element is located at said first position, said second area being inserted in the optical path between said light source unit and said modulating optical system when said filtering optical element is located at said second position.

11. The laser imaging apparatus according to claim 1, further comprising a beam separating optical system that separates the first beam from the second beam so that only the first beam is incident on the surface to be scanned.

12. The laser imaging apparatus according to claim 11, wherein said beam separating optical system is provided on a downstream side of said modulating optical system and on an upstream side of the surface to be scanned.

13. The laser imaging apparatus according to claim 11, wherein said beam separating optical system includes a dichroic mirror.

14. The laser imaging apparatus according to claim 1, wherein said modulating optical system includes:
 a reduction optical system that reduces a diameter of a beam incident thereon;
 a modulator that ON-OFF modulates an incident beam in accordance with an image pattern to be formed on the surface to be scanned; and
 a collimating lens that collimates the beam modulated by said modulator.

15. The laser imaging apparatus according to claim 14, wherein said modulator includes an acousto-optical modulator.

16. The laser imaging apparatus according to claim 1, a chromatic aberration of said modulating optical system in respect to the first beam and the second beam is compensated.

17. The laser imaging apparatus according to claim 1, wherein the non-visible light is ultraviolet light.

18. The laser imaging apparatus according to claim 1, wherein said light source unit includes a filter that reduces the intensity of visible light.

19. A laser imaging apparatus, comprising:
 a light source unit that emits a laser beam including a first beam and a second beam, central axes of the first and second beams substantially coinciding with each other, the first beam including non-visible light, the second beam including visible light;
 a modulating optical system that modulates the beam emitted by said light source unit;
 a deflector that deflects the beam modulated by said modulating optical system, the deflected beam scanning within a predetermined angular range;
 an imaging optical system that converges the deflected beam to form a scanning beam spot on a surface to be scanned,
 wherein said light source unit includes:
 an excitation light source that emits the second beam, which serves as an excitation beam, having a visible wavelength;
 a laser medium that is excited by the excitation beam to emit the first beam; and
 a switching system that switches optical paths of the laser beam emitted by said excitation light source such that the laser beam emitted by said excitation light source is emitted from said light source unit or is incident on said laser medium, the first beam being emitted by said laser medium in response to incidence of the excitation beam on said laser medium.

20. A laser imaging apparatus, comprising:
 a light source unit that emits a laser beam including a first beam and a second beam, central axes of the first and second beams substantially coinciding with each other, the first beam including non-visible light, the second beam including visible light;
 a modulating optical system that modulates the beam emitted by said light source unit;
 a deflector that deflects the beam modulated by said modulating optical system, the deflected beam scanning within a predetermined angular range; and
 an imaging optical system that converges the deflected beam to form a scanning beam spot on a surface to be scanned, wherein only the first beam is directed from said light source unit to said modulating optical system when imaging is performed, and wherein only the second beam is directed from said light source unit to said modulating optical system when alignment is performed.

21. A laser imaging apparatus, comprising:

a light source unit that emits a laser beam including a first beam and a second beam, central axes of the first and second beams substantially coinciding with each other, the first beam including non-visible light, the second beam including visible light;

a modulating optical system that modulates the beam emitted by said light source unit;

a deflector that deflects the beam modulated by said modulating optical system, the deflected beam scanning within a predetermined angular range;

an imaging optical system that converges the deflected beam to form a scanning beam spot on a surface to be scanned; and a filtering system provided between said light source unit and said modulating optical system, said filtering system selectively transmits one of the first beam and the second beam, wherein said filtering system includes a filtering optical element with a first area that transmits only the non-visible light and a second area that transmits only the visible light, said filtering optical element being movable between a first position and a second position, said first area being inserted in an optical path between said light source unit and said modulating optical system when said filtering optical element is located at said first position, said second area being inserted in the optical path between said light source unit and said modulating optical system when said filtering optical element is located at said second position.

22. A laser imaging apparatus, comprising:

a light source unit that emits a laser beam including a first beam and a second beam, central axes of the first and second beams substantially coinciding with each other, the first beam including non-visible light, the second beam including visible light;

a modulating optical system that modulates the beam emitted by said light source unit, the first beam being configured to form an image on the surface to be scanned, the second beam being configured to align the modulating optical system by adjusting a positional relationship of the first beam with respect to the optical axis of the modulating optical system;

a deflector that deflects the beam modulated by said modulating optical system, the deflected beam scanning within a predetermined angular range; and an imaging optical system that converges the deflected beam to form a scanning beam spot on a surface to be scanned, wherein said light source unit includes:

a first laser source that emits the first beam;

a second laser source that emits the second beam; and a beam combining optical system that combines the first beam and second beam such that the central axes of the first beam and the second beam coincide with each other, wherein said first laser source and said second laser source are selectively actuated so that one of the first beam and the second beam is emitted.

* * * * *